United States Patent [19]

Ichitsubo

[11] Patent Number: 4,734,591
[45] Date of Patent: Mar. 29, 1988

[54] FREQUENCY DOUBLER

[75] Inventor: Ikuroh Ichitsubo, Sagamihara, Japan

[73] Assignee: Kabushiki Kaisha Toshiba, Kawasaki, Japan

[21] Appl. No.: 851,161

[22] Filed: Apr. 14, 1986

[30] Foreign Application Priority Data

Apr. 26, 1985 [JP] Japan ................... 60-89975

[51] Int. Cl.[4] ............................................. H03B 19/00
[52] U.S. Cl. .................................. 307/219.1; 307/304; 333/218; 328/20
[58] Field of Search .................. 307/219.1, 271, 529, 307/304; 328/15, 20; 333/218; 363/159, 163

[56] References Cited

U.S. PATENT DOCUMENTS

| 4,308,473 | 12/1981 | Carnes | 307/529 |
| 4,327,343 | 4/1982 | Cornish | 333/218 |
| 4,334,324 | 6/1982 | Hoover | 307/304 |
| 4,511,813 | 4/1985 | Pan | 307/511 |
| 4,611,184 | 9/1986 | Kumar | 307/304 |

OTHER PUBLICATIONS

Pucel, "Power Combiner Performance of GaAs MESFET", Microwave Journal (USA), vol. 23, No. 3, Mar. 80, pp. 51-56.

Performance of a Dual-Gate GaAs MESFET as a Frequency Multiplier at Ku-Bands; Philip T. Chen et al; IEEE Trans. on Microwave Theory and Techniques, vol. MTT-27, No. 5, May 1979, pp. 411-415.

Balanced Dual Gate GaAs FET Doublers; Roger Stancliff; MTT-S International Microwave Symposium Digest, 1981, pp. 143-145.

Primary Examiner—Stanley D. Miller
Assistant Examiner—Timothy P. Callahan
Attorney, Agent, or Firm—Oblon, Fisher, Spivak, McClelland & Maier

[57] ABSTRACT

A frequency doubler is disclosed in which an input signal is supplied to the respective gates of first and second field effect transistors with a phase difference corresponding to a one half wave of the input signal and a signal of a doubler frequency wave is obtained from the drain of the second field effect transistor.

7 Claims, 11 Drawing Figures

F I G. 3
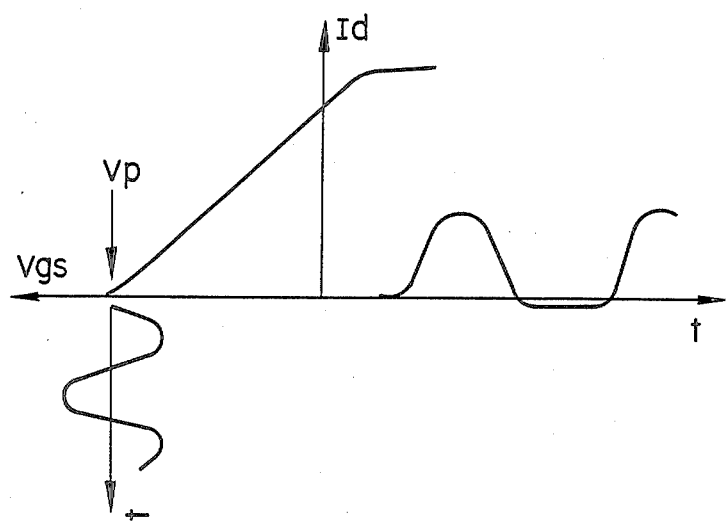
F I G. 4
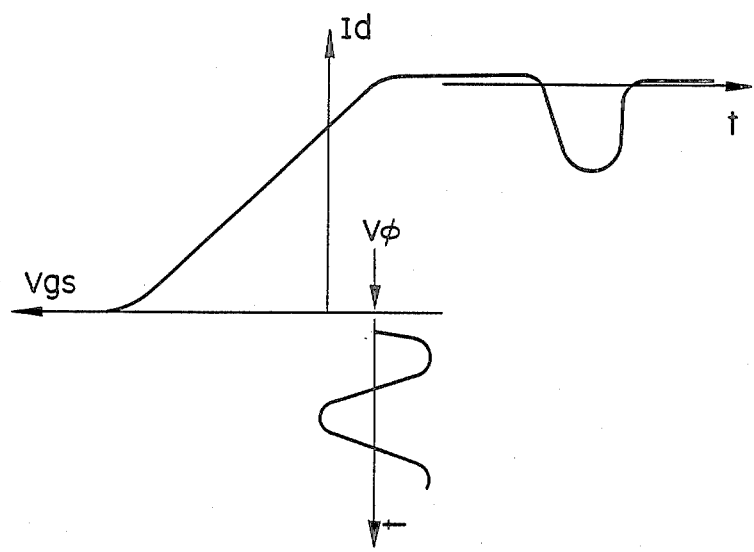

F I G. 5
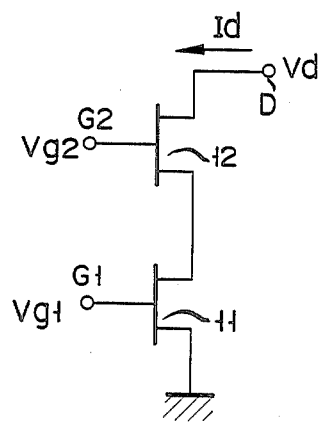
F I G. 6
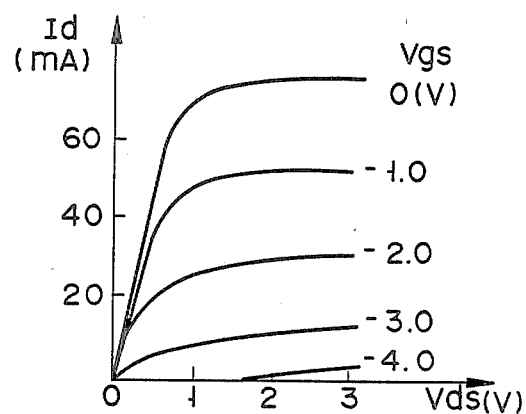

FREQUENCY DOUBLER

BACKGROUND OF THE INVENTION

1. Field of the Invention

This invention relates to a frequency doubler for a microwave band which uses field effect transistors device.

2. Discussion of Background

A frequency doubler for a microwave band is used to double a high-quality oscillation output for a low frequency when a high-frequency signal which satisfies a required output level, frequency stability, noise characteristic, etc. cannot be obtained in a direct oscillation mode.

The frequency doubler becomes more and more important due to the use of a high frequency wave of the order of, for example, millimeters in a communication field and so on.

A frequency doubler using a field effect transistor (hereinafter referred to as an FET) device is higher in conversion gain than a frequency doubler using, for example, a step recovery diode or a varactor diode, and suitable for a monolithic microwave integrated circuit (hereinafter referred to as an MMIC) which is widely expected to be a rapidly growing field. For this reason, MMICs can be used as a dominant doubler for a microwave band and thus will have many practical applications. Since such a doubler allows the use of either single gate FETs or dual gate FET structure and operates on substantially the same principle, a conventional doubler using the dual gate FET structure will be explained below with reference to FIG. 1.

FIG. 1 shows an equivalent circuit of a dual gate FET structure comprised of a cascade connection of two single gate FETs 1 and 2, in which the gate of first FET 1 corresponds to a first gate of the dual gate FET structure and the gate of second FET 2 corresponds to a second gate of the dual gate FET structure. In order to perform a frequency-doubling function, an input signal of a fundamental frequency fo is input to the first gate of the dual gate FET structure so that the drain current waveform is deformed due to the nonlinear effect of the dual gate FET structure. Of the deformed current wave, only a double-frequency component is selected through band-pass filter 3 connected to the drain of the dual gate FET structure and is delivered as a double frequency 2fo through matching circuit 4. The gate of second FET 2 is grounded through impedance 5. Gate biases Vg1 and Vg2 are applied respectively through frequency choking coils 6 and 7 to the gates of first and second FETs 1 and 2. A drain bias Vd is supplied through frequency choking coil 8 to the drain of second FET 2.

If the current distortion mechanism of the aforementioned circuit arrangement is explained in connection with the single gate FETs, then three kinds of modes are involved as shown, for example, in FIGS. 2, 3 and 4.

That is, in the mode as shown in FIG. 2 a drain current Id is deformed by greatly varying a drain-to-source voltage Vds with a gate-to-source voltage Vgs fixed; in the mode as shown in FIG. 3 a drain current deformation is produced due to a pinch-off effect produced when the gate-to-source voltage Vgs varies in the neighborhood of a pinch-off voltage Vp; and in the mode as shown in FIG. 4 the gate-to-source voltage Vgs varies in the neighborhood of a built-in voltage $V\phi$, saturating a drain current.

The operation of the doubler using the dual gate FET structure becomes very complex due to a mutual operational relation of two single gates FET and to the involvement of the three kinds of modes. In order to attain a maximal conversion gain it is necessary to adjust the fundamental power level of the bias voltages of the first and second gates of the dual gate FET structure, etc. to their optimal levels.

As we think evident from the above, the conventional doubler operates on the principle that deformation is induced in the drain current of the dual gate FET structure and a double-frequency component is selectively taken therefrom. Considered from the standpoint of the conversion gain, the frequency doubling of the fundamental wave is not necessarily implemented with maximum efficiency; there remains room for improvement. The drain current contains many unwanted frequency components, such as the fundamental wave, triple frequency wave, quadruple frequency wave, . . . in addition to the desirable double frequency wave. In order to eliminate these unwanted frequency waves it is necessary to employ a band-pass filter with an excellent selection function. Thus a bulkier circuit results. The MMIC whose manufacturing cost is proportional to the area of a chip is not desirable from the standpoint of economy.

SUMMARY OF THE INVENTION

It is accordingly the object of this invention to provide a frequency doubler which is higher in a conversion efficiency with which the double-frequency wave is obtained and lesser in unwanted waves and thus can eliminate the need of providing a special band-pass filter of a better selectivity.

The frequency doubler of this invention is characterized in that it has two FETs which receives a signal of a fundamental frequency wave with a phase difference of substantially 180°.

According to this invention there is provided a compact, low-cost frequency doubler which permits the obtainment of a double frequency wave over a broader bandwidth range with better conversion efficiency, generation of lesser unwanted waves and thus elimination of the need for a band-pass filter of a better selectivity, and involvement of a lower dissipation power due to the cascade connection of two FETs.

BRIEF DESCRIPTION OF THE DRAWINGS

FIGS. 2 to 4 are views for explaining a current deformation which is produced to obtain a double frequency;

FIG. 5 is a view showing an equivalent circuit of a dual gate FET structure;

FIG. 6 is a view showing one example of the current characteristics of an FET;

DETAILED DESCRIPTION OF THE PREFERRED EMBODIMENT

A frequency doubler according to one embodiment of this invention will be explained below, as one example, in connection with a dual gate FET structure.

First an explanation will be made as to the current characteristic of an ordinary dual gate FET structure.

In an equivalent circuit of a dual gate FET structure as shown in FIG. 5, first single gate FET 11 has a grounded source and second single gate FET 12 has its source connected to the drain of first single gate FET 12. A drain bias Vd is applied to the drain D of second FET 12, gate bias Vg1 is applied to the gate G1 of first FET 11, and gate Vg2 is applied to the gate G2 of second FET 12.

Figure 1:
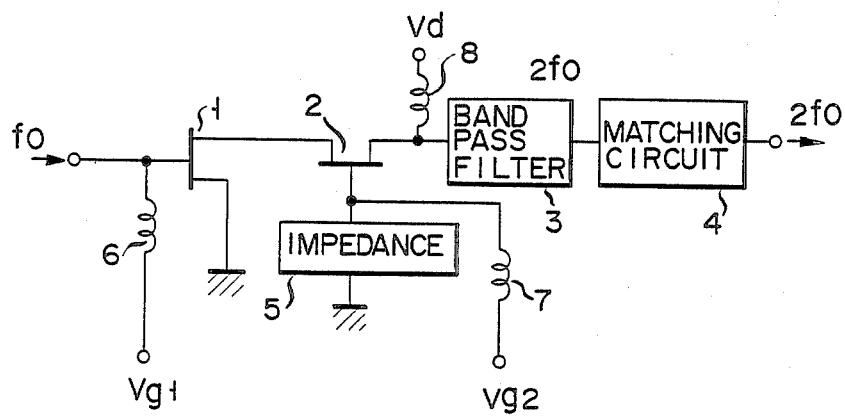
FIG. 1 is a circuit diagram showing one form of a conventional frequency doubler.
Figure 2:
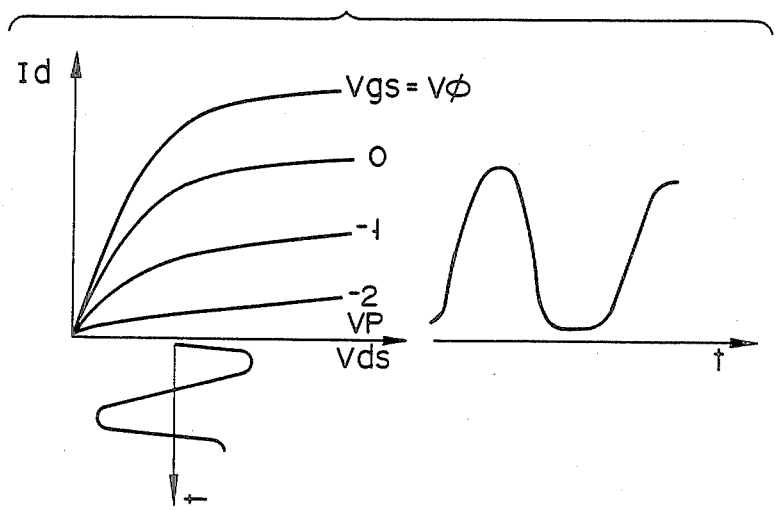
Figure 7:
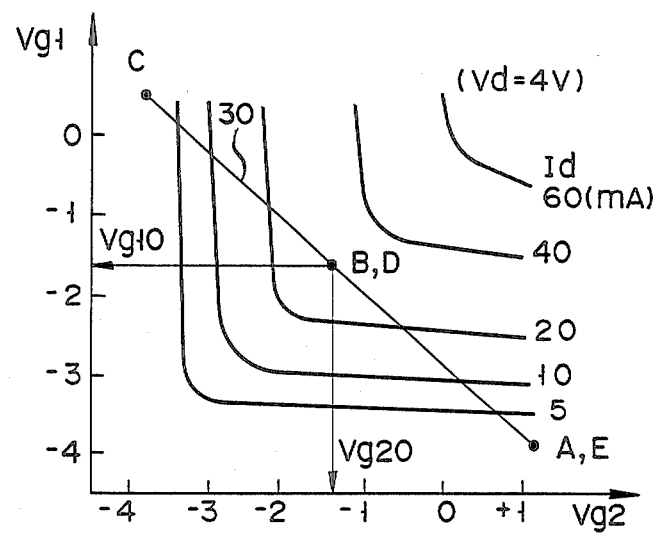
FIG. 7 is a graph showing the dependence of a drain current upon gate biases when FETs as shown in FIG. 6 are connected in a cascade configuration.

If respective FETs 11 and 12 have the DC characteristic as shown in FIG. 6, then the dependence of the drain current Id upon first and second gate biases Vg1 and Vg2 in that dual gate FET structure is as shown in FIG. 7. As evident from the above, the dual gate FET structure is characterized in that the drain current is substantially symmetric with respect to gate biases Vg1 and Vg2 and has a gate voltage dependence characteristic approximate to the following Equation (1):

$$Id \approx k(Vg1 + Eg10)(Vg2 + Eg20) \quad (1)$$

where k, Eg10 and Eg20=constants, $$Eg10 \approx Eg20 = \sqrt{\frac{Ido}{K}}$$

and Ido is a value of Id at Vg1=Vg2=0.

Figure 8:
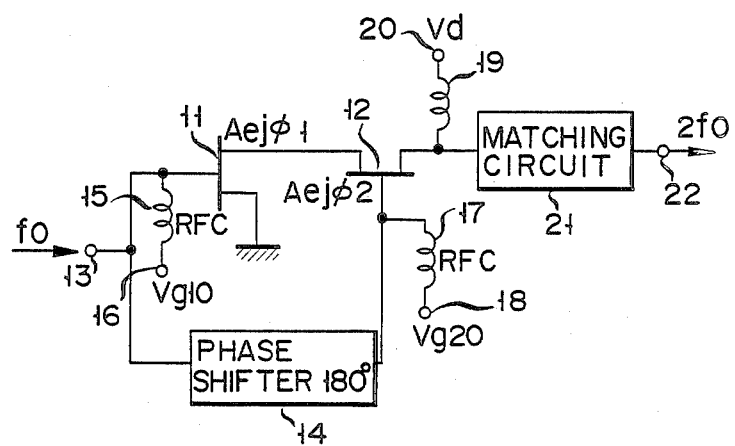
FIG. 8 is a circuit diagram showing a frequency doubler according to one embodiment of this invention.

FIG. 8 shows a frequency doubler according to the preferred main embodiment of this invention. In this embodiment a dual gate FET structure is represented as a circuit array equivalent to a cascade-connected array of single gate FETs 11 and 12 in which the drain of first single gate FET 11 is connected to the source of second single gate FET 12.

An input signal f0 of a fundamental wave is coupled directly to the gate of first single gate FET 11 and through a 180° phase shifter 14 to the gate of second single gate FET 12, noting that phase shifter 14 imparts a 180° phase shift to that high frequency voltage.

First single gate FET 11 has a grounded source and a gate connected through high-frequency choke coil 15 to terminal 16 to which gate bias Vg10 is applied. Second single gate FET 12 has a gate connected through high-frequency choke coil 17 to terminal 18, to which gate bias Vg20 is applied, and a drain connected through matching circuit 21 to output terminal 22 and through high-frequency choke coil 19 to terminal 20 to which the drain bias voltage Vd is applied.

That is, in this embodiment, the input signal f0 of a fundamental wave is input to the second gate of the dual gate FET structure and has a phase $\phi 2$ different by 180° (i.e. one half the wavelength of the fundamental input signal) from the phase $\phi 1$ in the first gate of the dual gate FET, noting that their voltages on these gates are at substantially the same level.

Figure 9:
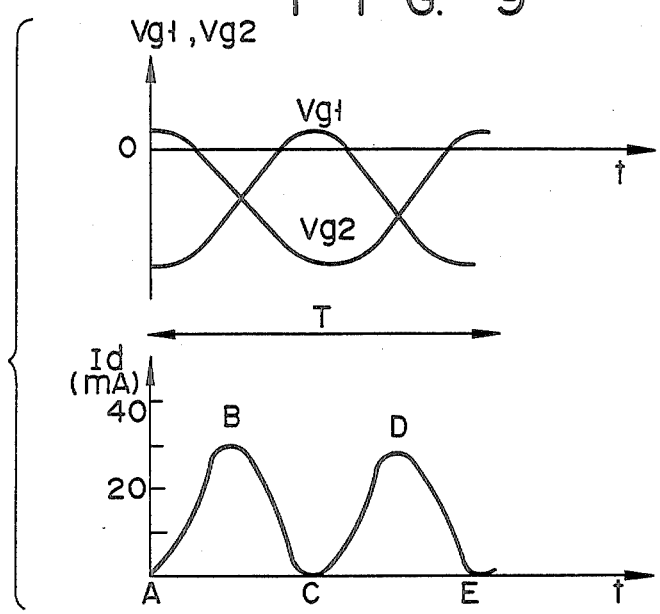
FIG. 9 is a waveform diagram for explaining the operation of the embodiment of FIG. 8.

This invention will be explained below, using a Vg1-Vg2 plane in FIG. 7. A voltage of the fundamental wave applied to the first and second gates with the same amplitude but the opposite phase is represented by straight line 30 in FIG. 7. The center B or D of straight line 30 in FIG. 7 corresponds to DC biases on the first and second gates of the dual gate FET structure and they are substantially equal (Vg10 $\approx$ Vg20). Now consider a trace A-B-C-D-E, corresponding to one period T of the fundamental wave, starting with a point A in FIG. 7. In this case, a time variation in the corresponding drain current appears as a wave as shown in FIG. 9. That is, a maximum current appears at two places in a swing of one period of the fundamental wave. Here the fundamental wave can be expressed as follows:

$$Vg1(t) = A\cos\omega t + Vg10 \quad (2)$$
$$Vg2(t) = -A\cos\omega t + VG20$$

$$Id(t) = k(A\cos\omega t + Vg10 + Eg10) \times (-A\cos\omega t + Vg20 + Eg20) \quad (3)$$

$$= k\left((Vg10 + Eg10)(Vg20 + Eg20) - \frac{A^2}{2} + \right.$$

$$\left. A(Vg20 + Eg20 - Vg10 - Eg10)\cos\omega t - \frac{A^2}{2}\cos 2\omega t \right)$$

$$\approx k\left((Vg10 + Eg10)(Vg20 + Eg20) - \frac{A^2}{2}\right) -$$

$$\frac{KA^2}{2}\cos 2\omega t$$

As evident from Equation (3), in the frequency doubler of this invention the fundamental wave is converted to almost a direct current and double-frequency components. It is therefore possible to suppress generation of an unwanted frequency component to a very small level.

This invention has been explained thus far as the double frequency being adequately lower than a cut-off frequency fc of the FET.

Here the cut-off frequency fc is given as $$fc \approx \frac{gm}{2\pi Cgs},$$

where Cgs and gm represent a gate-to-source capacitance and transconductance, respectively. If the double frequency is of the order of the cut-off frequency fc, an effect of stray impedance and stray capacitance, such as Cgs, cannot be disregarded, in which case the amplitude and phase conditions for an optimum double frequency are varied in the case of a lower frequency. In this case, the trace of straight line 30 in FIG. 7 takes a loop-like configuration, causing the conversion gain to be somewhat lowered and thus involving more unwanted signal components. Even in this case, however, the principle of the basic doubler operation holds.

A frequency doubler using a dual gate FET structure comprised of a cascade connection of two single gate FETs of a gate length Lg=1 $\mu$m and a gate width Wg=200 $\mu$m with fc=25 GHz was prepared and numerically analyzed by a time-domain circuit-analysis program, the result of which is as follows.

In this case, note that the band pass filter for the double frequency selection is not implemented in the doubler circuit.

(1) When the fundamental wave f0=1 GHz and phase difference ($\phi 1 - \phi 2$)=180°, the conversion gain was 10 dB and unwanted wave suppression ratio (2

GHz signal power/unwanted component power) was 10 dB.

(2) When the fundamental wave f0=10 GHz and phase difference $(\phi_1-\phi_2)=130°$, the conversion gain was 2 dB and unwanted component power ratio (power 20 GHz/unwanted component power) was 6 dB.

From these results it will be appreciated that the frequency doubler is high in conversion gain, excellent in the suppression characteristic of unwanted waves in particular and very advantageous in size and cost in comparison with the conventional counterpart. Furthermore, since the band-pass filter can be omitted or simplified, a frequency doubler of a broader band range can be obtained which has not been possible in the conventional counterpart.

Although in the aforementioned embodiment this invention has been explained as using the dual gate FET structure, the same effect can also be obtained using a substantially equivalent circuit which is comprised of a series connection of two single gate FETs.

Figure 10:
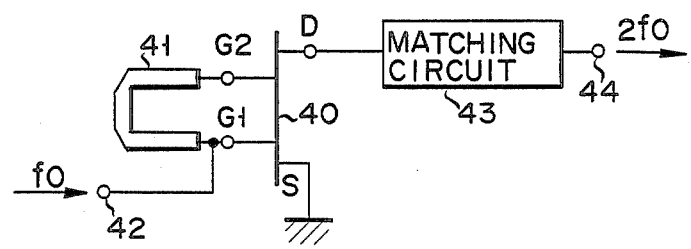
FIGS. 10 and 11 each shows a frequency doubler according to another embodiment of this invention.

This invention is not restricted to the aforementioned embodiment. For example, this invention can also be achieved using a dual gate FET structure 40 having first and second gates G1 and G2 between which λ/2 line path 41 (where λ is the wavelength of the fundamental frequency) is connected and between which a 180° phase difference is involved, as shown in FIG. 10. In FIG. 10, a fundamental wave f0 is lead to terminal 42 and a double frequency 2f0 appears at the drain of the dual gate FET structure, which is coupled through matching circuit 43 to output terminal 44. A DC circuit is omitted for simplicity in FIG. 10.

Figure 11:
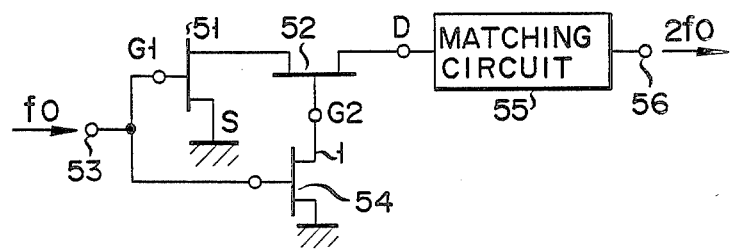

FIG. 11 is a block diagram showing a frequency doubler according to another embodiment of this invention. In this configuration, the combination of FET51 and FET52 comprises a dual gate FET structure and its first gate electrode G1 is driven by an input signal as in the cases of FIGS. 8 and 10.

Since an FET operation involves signal phase inversion between gate and drain voltages, a source grounded FET54 is introduced as a 180-degree phase shifting means. The connection of the gate electrode of FET54 to signal input terminal 53 and the drain electrode 1 of the FET to the gate electrode G2 of the second FET52 can bring in the required phase difference between the gate electrodes G1 and G2 of the first and second FETs. The sources of FETs 51 and 54 are grounded. The drain of single gate FET 52 is connected through matching circuit 55 to output terminal 56 where a double frequency output 2f0 is delivered.

What is claimed is:
1. A frequency doubler comprising:
a first field effect transistor having a gate, a source, a drain and a current channel provided between the source and drain;
a second field effect transistor having a gate, a source, a drain and a current channel provided between the source and drain, the current channels of the first and second field effect transistors being connected in series with each other; and
means for applying across the gate and source of the first field effect transistor and across the gate of the second field effect transistor and the source of the first field effect transistor signal voltages having substantially the same voltage amplitudes and frequencies and having a phase difference of about 180 degrees;
wherein an output signal having a frequency two times that of said signal voltages is obtained from the drain of said second field effect transistor.

2. A frequency doubler according to claim 1, in which said first and second field effect transistors are comprised of a single dual gate field effect transistor structure.

3. A frequency doubler according to claim 1, wherein said signal voltage applying means includes a phase shifting means which is comprised of a line path having a length corresponding to a one-half wavelength of that of said applied signal voltage.

4. A frequency doubler according to claim 1, wherein said signal voltage applying means includes a phase shifting means which is comprised of a third field effect transistor having a gate, a drain and a source, for inverting a phase of the signal voltage supplied to its gate, the drain being connected to the gate of said second field effect transistor and the source being connected to ground.

5. A frequency doubler comprising:
a first field effect transistor having a gate, a source, a drain and a current channel provided between the source and drain;
a second field effect transistor having a gate, a source, a drain and a current channel provided between the source and drain, the current channels of the first and second field effect transistors being connected in series with each other;
means for applying a first signal voltage across the gate and source of the first field effect transistor; and
means for applying a second signal voltage across the source of the first field effect transistor and the gate of the second field effect transistor, the second signal voltage having substantially the same voltage and frequency and having a phase difference of about 180 degrees with respect to the first signal voltage;
wherein an output signal having a frequency two times that of each of said first and second signal voltages is obtained from the drain of said second field effect transistor.

6. A frequency doubler according to claim 1, wherein said first and second field effect transistors are comprised of a signal dual gate field effect transistor structure.

7. A frequency doubler according to claim 5, wherein said first and second field effect transistors are comprised of a single dual gate field effect transistor structure.

* * * * *